(12) United States Patent  
Lee

(10) Patent No.: US 8,853,854 B2  
(45) Date of Patent: Oct. 7, 2014

(54) SEMICONDUCTOR PACKAGE AND METHOD OF MANUFACTURING THE SAME

(75) Inventor: Jong-Joo Lee, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 134 days.

(21) Appl. No.: 13/221,494

(22) Filed: Aug. 30, 2011

(65) Prior Publication Data

US 2012/0126400 A1   May 24, 2012

(30) Foreign Application Priority Data

Nov. 18, 2010   (KR) .......................... 10-2010-0114918

(51) Int. Cl.
| | |
|---|---|
| *H01L 23/498* | (2006.01) |
| *H01L 23/48* | (2006.01) |
| *H01L 25/065* | (2006.01) |
| *H01L 23/31* | (2006.01) |

(52) U.S. Cl.
CPC ... *H01L 25/0657* (2013.01); *H01L 2225/06527* (2013.01); *H01L 23/481* (2013.01); *H01L 2225/06544* (2013.01); *H01L 2224/16225* (2013.01); *H01L 2224/16145* (2013.01); *H01L 2225/06513* (2013.01); *H01L 23/3128* (2013.01)
USPC .................. 257/737; 257/774; 257/E21.449; 257/E23.067; 438/279; 438/104

(58) Field of Classification Search
USPC .................. 257/737, 774, E21.499, E23.067, 257/E23.068
See application file for complete search history.

(56) References Cited

U.S. PATENT DOCUMENTS

| | | | |
|---|---|---|---|
| 8,110,900 B2 * | 2/2012 | Yoshimura et al. ............. | 257/621 |
| 2005/0146049 A1 * | 7/2005 | Kripesh et al. ................. | 257/776 |
| 2007/0205847 A1 | 9/2007 | Kushta et al. | |
| 2007/0222083 A1 * | 9/2007 | Kripesh et al. ................. | 257/774 |
| 2011/0304008 A1 * | 12/2011 | Yang ............................. | 257/506 |
| 2012/0020028 A1 * | 1/2012 | Bachman et al. .............. | 361/719 |

FOREIGN PATENT DOCUMENTS

| | | |
|---|---|---|
| JP | 2007-073772 A | 3/2007 |
| KR | 10-0887140 B1 | 3/2009 |

* cited by examiner

*Primary Examiner* — Julio J Maldonado  
*Assistant Examiner* — Jaehwan Oh  
(74) *Attorney, Agent, or Firm* — Harness, Dickey & Pierce, P.L.C.

(57) ABSTRACT

A semiconductor package may include a package substrate, a first semiconductor chip and a second semiconductor chip. The first semiconductor chip may be arranged on the package substrate. The first semiconductor chip may have a plug electrically connected to the package substrate and at least one insulating hole arranged around the plug. The second semiconductor chip may be arranged on the first semiconductor chip. The second semiconductor chip may be electrically connected to the plug. Thus, the insulating hole and the insulating member may ensure an electrical isolation between the plug and the first semiconductor chip, and between the plugs.

17 Claims, 9 Drawing Sheets

SEMICONDUCTOR PACKAGE AND METHOD OF MANUFACTURING THE SAME

CROSS-RELATED APPLICATION

This application claims priority under 35 USC §119 to Korean Patent Application No. 2010-114918, filed on Nov. 18, 2010 in the Korean Intellectual Property Office (KIPO), the contents of which are herein incorporated by reference in their entirety.

BACKGROUND

1. Field

Example embodiments relate to a semiconductor package and a method of manufacturing the same. More particularly, example embodiments relate to a flip chip package including a semiconductor chip and a package substrate electrically connected with each other via conductive bumps, and a method of manufacturing the flip chip package.

2. Description of the Related Art

Generally, a plurality of semiconductor fabrication processes may be performed on a semiconductor substrate to form a plurality of semiconductor chips. In order to mount the semiconductor chips on a printed circuit board (PCB), a packaging process may be performed on the semiconductor chips to form semiconductor packages.

The semiconductor package may include a package substrate, a semiconductor chip mounted on the package substrate, and conductive connecting members for electrically connecting the semiconductor chip with the package substrate. The conductive connecting members may include conductive wires, conductive bumps, etc.

A semiconductor package including the conductive bumps may be referred to as a flip chip package. When flip chip packages having similar sizes may be stacked, semiconductor chips in the flip chip packages may be electrically connected with each other via conductive bumps and plugs. In contrast, when flip chip packages having different sizes may be stacked, an interposer chip may be interposed between semiconductor chips in the flip chip packages.

The plugs of the flip chip package may be arranged in the semiconductor chip. Because the semiconductor chip may include conductive silicon, an insulating layer may be formed on an inner surface of a plug hole to electrically isolate the plug from the semiconductor chip and the plugs from each other.

However, the insulating layer may not sufficiently insulate the plug from the semiconductor chip and the plugs from each other. Thus, signals transmitting through the plugs may be lost through the semiconductor chip and the adjacent plugs.

Further, when the interposer chip includes a conductive substrate, the above-mentioned problems may be generated in the interposer chip.

SUMMARY

Example embodiments provide a semiconductor package capable of suppressing or reducing an electrical interference between a plug and a semiconductor chip or an adjacent plug.

Example embodiments also provide a method of manufacturing the above-mentioned semiconductor package.

Example embodiments also provide an interposer chip capable of suppressing or reducing an electrical interference between an interposer plug and a conductive substrate or an adjacent interposer plug.

Example embodiments also provide a method of manufacturing the above-mentioned interposer chip.

Example embodiments also provide a semiconductor package including the above-mentioned interposer chip.

In accordance with example embodiments, there is provided a semiconductor package. The semiconductor package may include a package substrate, a first semiconductor chip and a second semiconductor chip. The first semiconductor chip may be arranged on the package substrate. The first semiconductor chip may have a plug electrically connected to the package substrate and at least one insulating hole arranged around the plug. The second semiconductor chip may be arranged on the first semiconductor chip. The second semiconductor chip may be electrically connected to the plug.

In example embodiments, the semiconductor package may further include an insulating member formed in the insulating hole.

In example embodiments, the insulating hole may be in plural concentrically arranged around the plug. The insulating hole may have a diameter smaller than that of the plug. The insulating hole may have a depth substantially the same as or less than a thickness of the plug. The insulating hole may have a diameter less than two times a thickness of an insulating member surrounding the plug. A distance between the plug and the insulating hole may be substantially the same as a width of a depletion region formed between a circuit of the first semiconductor chip and the plug. The insulating hole may be concentratedly arranged between the circuit of the first semiconductor chip and the plug.

In example embodiments, the semiconductor package may further include a first conductive bump interposed between the package substrate and the first semiconductor chip to electrically connect the plug with the package substrate, and a second conductive bump interposed between the first semiconductor chip and the second semiconductor chip to electrically connect the plug with the second semiconductor chip.

In example embodiments, the semiconductor package may further include a conductive interposer chip interposed between the first semiconductor chip and the second semiconductor chip. The interposer chip may include an interposer plug electrically connected between the plug and the second semiconductor chip, and at least one interposer-insulating hole arranged around the interposer plug.

According to example embodiments, there is provided a method of manufacturing a semiconductor package. In the method of manufacturing the semiconductor package, a plug hole and at least one insulating hole arranged around the plug hole may be formed in a first semiconductor chip. An insulating layer may be formed on an inner surface of the plug hole. A plug may be formed on the insulating layer to fill the plug hole. The first semiconductor chip may be stacked on a package substrate to electrically connect the plug with the package substrate. A second semiconductor chip may be stacked on the first semiconductor chip to electrically connect the second semiconductor chip with the plug.

In example embodiments, forming the plug hole may be performed simultaneously with forming the insulating hole.

In example embodiments, the method may further include filling the insulating hole with an insulating member. Filling the insulating hole with the insulating member may be performed simultaneously with forming the insulating layer on the inner surface of the plug hole.

According to example embodiments, there is provided an interposer chip. The interposer chip may include a conductive substrate, an insulating layer and an interposer plug. The conductive substrate may have an interposer plug hole and at least one interposer-insulating hole arranged around the interposer plug hole. The insulating layer may be formed on an inner surface of the interposer plug hole. The interposer plug may be formed on the insulating layer to fill up the interposer plug hole.

In example embodiments, the interposer chip may further include an insulating member formed in the interposer-insulating hole.

According to example embodiments, there is provided a method of manufacturing an interposer chip. In the method of manufacturing the interposer chip, an interposer plug hole and at least one interposer-insulating hole arranged around the interposer plug hole may be formed in a conductive substrate. An insulating layer may be formed on an inner surface of the interposer plug hole. An interposer plug may be formed on the insulating layer to fill up the interposer plug hole.

In example embodiments, the method may further include filling the interposer-insulating hole with an insulating member.

According to example embodiments, there is provided a semiconductor package. The semiconductor package may include a package substrate, a first semiconductor chip, an interposer chip and a second semiconductor chip. The first semiconductor chip may be arranged on the package substrate. The first semiconductor chip may have a plug electrically connected to the package substrate and at least one insulating hole arranged around the plug. The interposer chip may be stacked on the first semiconductor chip. The interposer chip may include an interposer plug electrically connected to the plug, and at least one interposer-insulating hole arranged around the interposer plug. The second semiconductor chip may be stacked on the interposer chip. The second semiconductor chip may be electrically connected to the interposer plug. The second semiconductor chip may have a size smaller than that of the first semiconductor chip.

In example embodiments, the semiconductor package may further include an insulating member formed in the insulating hole and the interposer-insulating hole.

In example embodiments, the semiconductor package may further include a first conductive bump interposed between the package substrate and the first semiconductor chip to electrically connect the plug with the package substrate, an interposer bump interposed between the first semiconductor chip and the interposer chip to electrically connect the plug with the interposer plug, and a second conductive bump interposed between the interposer chip and the second semiconductor chip to electrically connect the interposer plug with the second semiconductor chip.

According to example embodiments, the insulating hole and the insulating member may ensure an electrical isolation between the plug and the first semiconductor chip, and between the plugs. Thus, losses of signals through the plug may be suppressed, so that a transmission speed of the signal may be increased.

In accordance with example embodiments, a semiconductor chip may include a plug extending through a thickness of the semiconductor chip and a plurality of insulating holes surrounding the plug, the plurality of insulating holes reinforcing an electrical isolation between the plug and the semiconductor chip.

In example embodiments, the semiconductor chip may further include a plurality of insulating members in the plurality of insulation holes.

In example embodiments, the semiconductor chip may further include an insulation layer on side walls of a plug hole that extends through the thickness of the semiconductor chip, the insulation layer being between the side walls of the plug hole and the plug.

In example embodiments the semiconductor chip may further include a circuit and a second plurality of insulating holes between the circuit and the plug.

In example embodiments the plurality of insulating holes may extend through the thickness of the semiconductor chip.

In example embodiments the plurality of insulating holes may not extend through the thickness of the semiconductor chip.

In accordance with example embodiments, a semiconductor package may include a package substrate and a semiconductor chip. In example embodiments the semiconductor chip may include a plug extending through a thickness of the semiconductor chip and a plurality of insulating holes surrounding the plug. In example embodiments the plurality of insulating holes may reinforce an electrical isolation between the plug and the semiconductor chip.

In example embodiments the semiconductor package may further include a first conductive bump between the semiconductor chip of claim and the package substrate and a second conductive bump between a second semiconductor chip and the semiconductor chip.

BRIEF DESCRIPTION OF THE DRAWINGS

Example embodiments will be more clearly understood from the following detailed description taken in conjunction with the accompanying drawings.

FIG. 1 is a cross-sectional view illustrating a semiconductor package in accordance with example embodiments;

FIG. 2 is an enlarged cross-sectional view illustrating a first semiconductor chip of the semiconductor package in FIG. 1;

FIG. 3 is an enlarged cross-sectional view illustrating a first semiconductor chip of a semiconductor package in accordance with example embodiments;

FIG. 4 is an enlarged plan view illustrating the first semiconductor chip in FIG. 3;

FIG. 5 is an enlarged cross-sectional view illustrating a first semiconductor chip of a semiconductor package in accordance with example embodiments;

FIG. 6 is an enlarged cross-sectional view illustrating a first semiconductor chip of a semiconductor package in accordance with example embodiments;

FIGS. 7 to 13 are cross-sectional views illustrating a method of manufacturing the semiconductor package in FIG. 1;

FIG. 14 is a cross-sectional view illustrating an interposer chip in accordance with example embodiments;

FIG. 15 is a cross-sectional view illustrating a semiconductor chip in accordance with example embodiments;

DETAILED DESCRIPTION OF THE EMBODIMENTS

Figure 1:
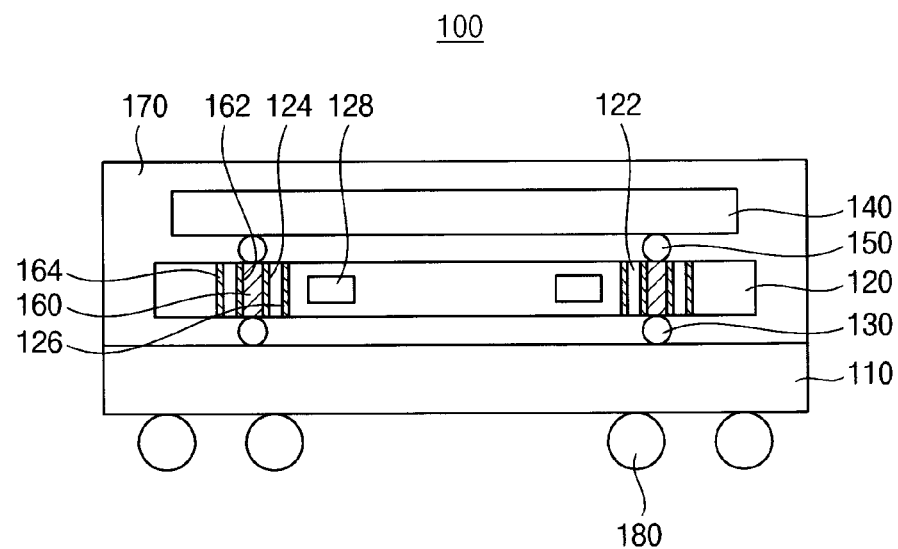
FIGS. 1 to 15 represent non-limiting, example embodiments as described herein.

Example embodiments will be described more fully hereinafter with reference to the accompanying drawings, in which example embodiments are shown. The present invention may, however, be embodied in many different forms and should not be construed as limited to example embodiments as set forth herein. Rather, example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Semiconductor Package

Figure 2:
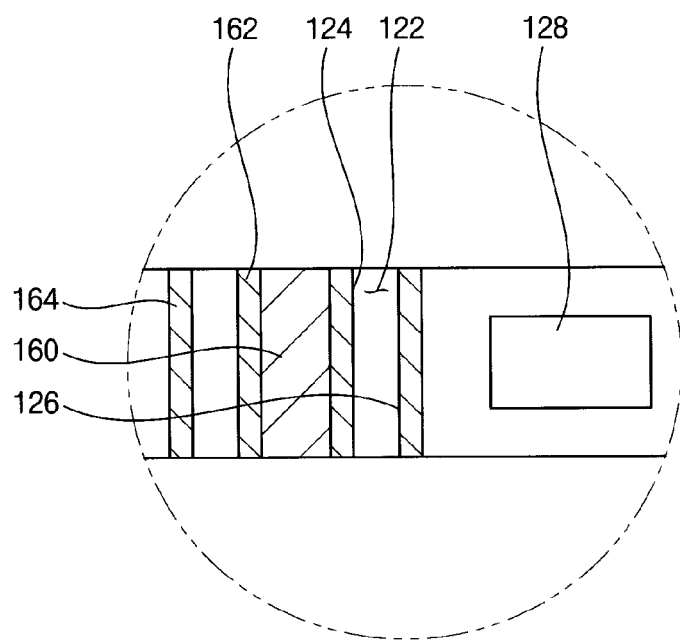

FIG. 1 is a cross-sectional view illustrating a semiconductor package in accordance with example embodiments, and FIG. 2 is an enlarged cross-sectional view illustrating a first semiconductor chip of the semiconductor package in FIG. 1.

Referring to FIG. 1, a semiconductor package 100 according to example embodiments may include a package substrate 110, a first semiconductor chip 120, a first conductive bump 130, a second semiconductor chip 140, a second conductive bump 150, a plug 160, a molding member 170 and external terminals 180.

The package substrate 110 may include an insulating substrate and a circuit pattern (not shown) built in the insulating substrate. The circuit pattern may be exposed through an upper surface and a lower surface of the package substrate 110.

The first semiconductor chip 120 may be arranged over the package substrate 110. In example embodiments, the first semiconductor chip 120 may include a conductive material, for example, silicon. The first semiconductor chip 120 may include a circuit 128.

In example embodiments, the first semiconductor chip 120 may have a plug hole 124 and a plurality of insulating holes 126. The plug hole 124 and the insulating holes 126 may be vertically formed through the first semiconductor chip 120. The circuit 128 may not be arranged between the plug hole 124 and the insulating holes 126, and between the insulating holes 126.

Referring to FIG. 2, the plug hole 124 and the insulating holes 126 may be exposed through an upper surface and a lower surface of the first semiconductor chip 120. Thus, the plug hole 124 and the insulating holes 126 may have substantially the same depth.

Figure 3:
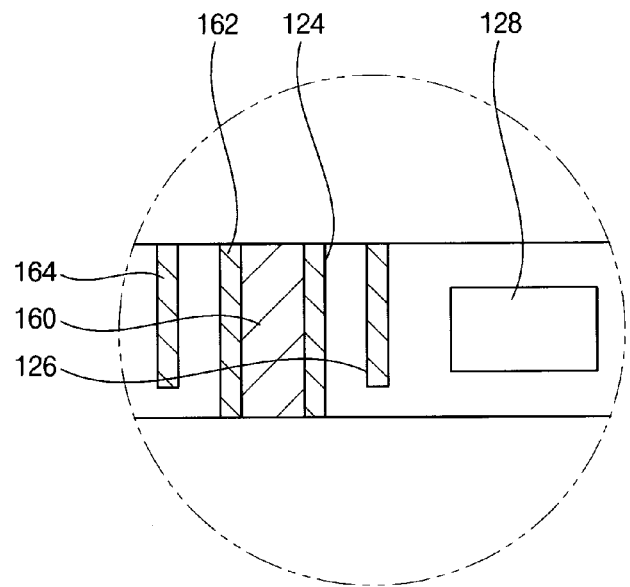

In example embodiments, referring to FIG. 3, the plug hole 124 may be exposed through the lower surface of the first semiconductor chip 120. In contrast, the insulating holes 126 may not be exposed through the lower surface of the first semiconductor chip 120. Thus, the insulating holes 126 may have a depth less than that of the plug hole 124.

An insulating layer 162 may be formed on an inner surface of the plug hole 124. In example embodiments, the insulating layer 162 may include oxide. The plug 160 may be formed on the insulating layer 162 to fill up the plug hole 124.

In example embodiments, the insulating holes 126 may be arranged around the plug holes 124. The insulating holes 126 may suppress an electrical interference between a signal transmitting through the plug 160 and the conductive material of the first semiconductor chip 120. Because only the insulating layer 162 may insufficiently isolate the plug 160 from the first semiconductor chip 120, the insulating holes 126 may reinforce an electrical isolation between the plug 160 and the first semiconductor chip 120, and between the plugs 160.

Further, the insulating holes 126 may be filled with air, so that an air gap may be formed between the plug 160 and the first semiconductor chip 120.

In example embodiments, the insulating holes 126 may have a diameter smaller than that of the plug holes 124. The insulating holes 126 may have a diameter of no more than two times a thickness of the insulating layer 162.

Figure 4:
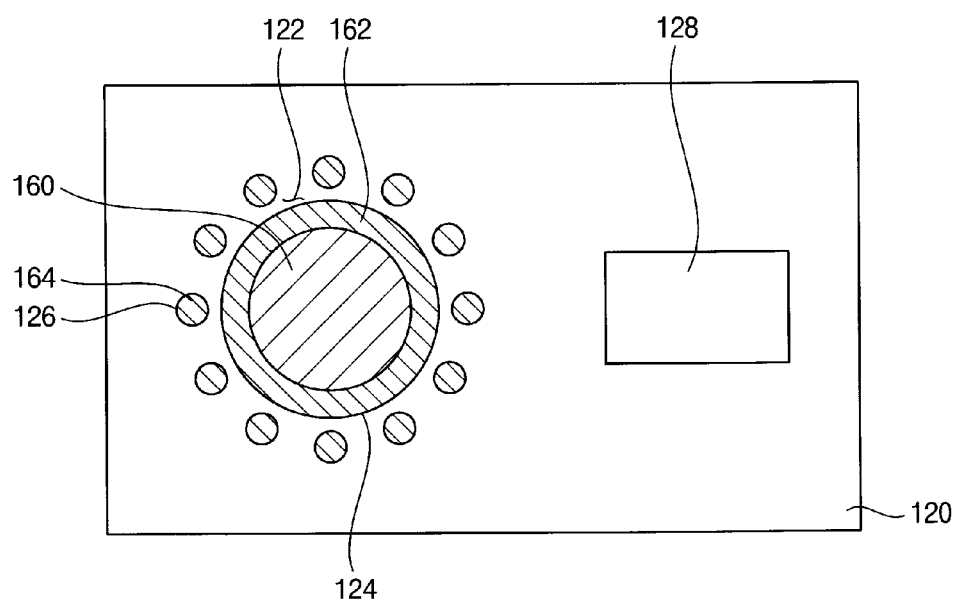

In example embodiments, referring to FIG. 4, the insulating holes 126 may be arranged in a single concentric circle around the plug hole 124. Alternatively, although not depicted in drawings, the insulating holes 126 may be arranged in at least two concentric circles around the plug hole 124.

In example embodiments, a structure including the circuit 128 of the first semiconductor chip 120, the insulating layer 162 and the plug 160 may correspond to a MOS structure. Thus, when a bias is applied to the plug 160, a portion of the first semiconductor chip 120 between the plug 160 and the circuit 128 may be converted into a depletion region 122 without conductivity. Because the depletion region 122 may have an insulating function, it may not be required to form the insulating holes 126 in the depletion region 122. Therefore, the insulating holes 126 may be positioned outside the depletion region 122. As a result, a gap between the plug hole 124 and the insulating holes 126 may be substantially the same as a width of the depletion region 122.

Figure 5:
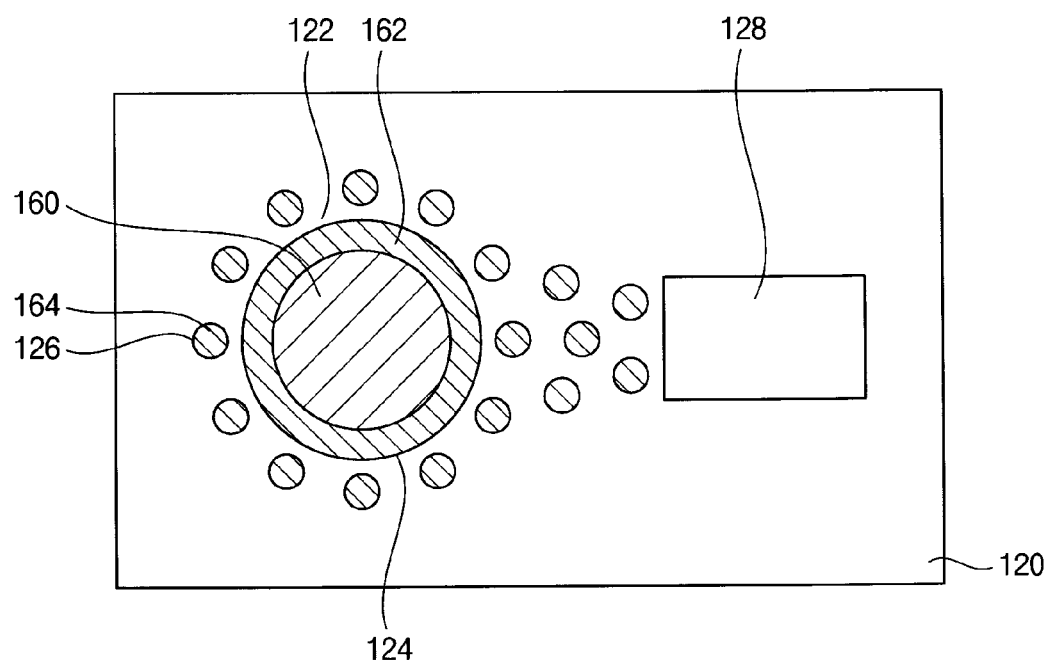
Figure 6:
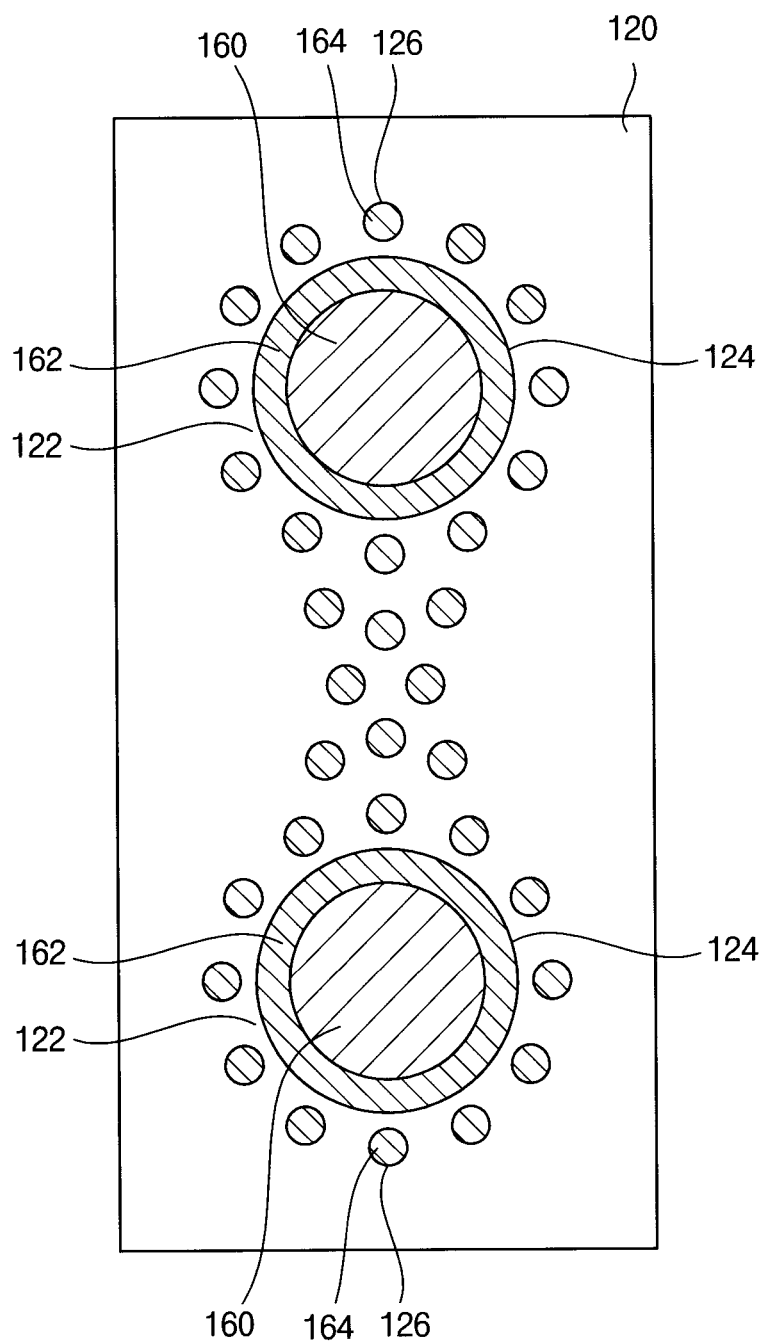

In example embodiments, the circuit 128 of the first semiconductor chip 120 may have great electrical influence on the plug 160. Thus, as shown in FIG. 5, the insulating holes 126 may be arranged between the circuit 128 and the plug 160. Further, as shown in FIG. 6, the insulating holes 126 may be arranged between the plugs 160.

In order to more ensure the electrical isolation between the plug 160 and the first semiconductor chip 120, an insulating member 164 may be formed in the insulating holes 126. In example embodiments, the insulating member 164 may include a material substantially the same as that of the insulating layer 162. Thus, the insulating member 164 may include oxide. That is, the insulating layer 162 and the insulating member 164 may be formed by a same process.

The first conductive bump 130 may be interposed between the first semiconductor chip 120 and the package substrate 110. The first conductive bump 130 may connect the plug 160 to the circuit pattern of the package substrate 110.

Alternatively, a conductive wire may be electrically connected between the first semiconductor chip 120 and the package substrate 110. Further, the first semiconductor chip 120 may be directly connected to the package substrate 110 by directly contacting the plug 160 with the circuit pattern of the package substrate 110.

The second semiconductor chip 140 may be arranged over the first semiconductor chip 120. In example embodiments, the second semiconductor chip 140 may have a size substantially the same as that of the first semiconductor chip 120.

The second conductive bump 150 may be interposed between the first semiconductor chip 120 and the second semiconductor chip 140. The second conductive bump 150 may connect the plug 160 to the second semiconductor chip 140.

Alternatively, a conductive wire may be electrically connected between the first semiconductor chip 120 and the second semiconductor chip 140. Further, the first semiconductor chip 120 may be directly connected to the second semiconductor chip 140 by directly contacting the plug 160 with a bonding pad of the second semiconductor chip 140.

The molding member 170 may be formed on the package substrate 110 to cover the first semiconductor chip 120 and the second semiconductor chip 140. In example embodiments, the molding member 170 may include an epoxy molding compound (EMC).

The external terminals 180 may be mounted on a lower surface of the package substrate 110. The external terminals 180 may be electrically connected to the circuit pattern of the package substrate 110. In example embodiments, the external terminals 180 may include solder balls.

Method of Manufacturing a Semiconductor Package

FIGS. 7 to 13 are cross-sectional views illustrating a method of manufacturing the semiconductor package in FIG. 1.

Figure 7:
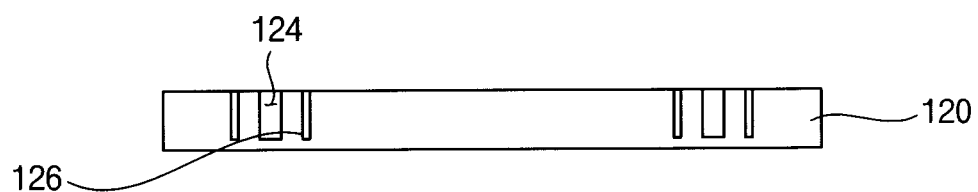

Referring to FIG. 7, the plug hole 124 and the insulating holes 126 may be formed from the upper surface of the first semiconductor chip 120. In example embodiments, as shown in FIG. 2, the plug hole 124 and the insulating holes 126 may have substantially the same depth. Alternatively, as shown in FIG. 3, the plug hole 124 may have a depth greater than that of the insulating holes 126. Further, the plug hole 124 and the insulating holes 126 may not be exposed through the lower surface of the first semiconductor chip 120. That is, the depths of the plug hole 124 and the insulation holes 126 may be less than a thickness of the first semiconductor chip 120.

Figure 8:
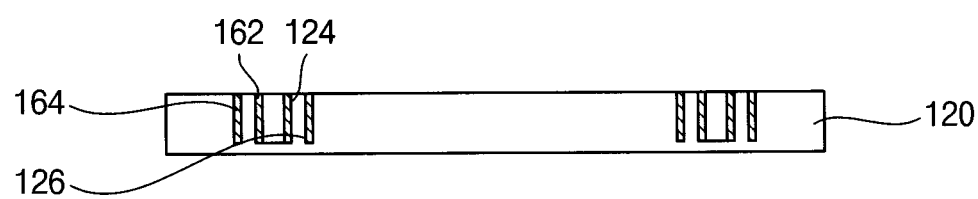

Referring to FIG. 8, the insulating layer 162 may be formed on the inner surface of the plug hole 124. Simultaneously, the insulating member 164 may be formed in the insulating holes 126. Thus, the insulating layer 162 and the insulating member 164 may include substantially the same material. In example embodiments, the insulating layer 162 and the insulating member 164 may include an oxide formed by a chemical vapor deposition (CVD) process or a thermal oxidation process.

In example embodiments, an oxidation of a conductive material in a portion of the first semiconductor chip 120 between the insulating holes 126 may more ensure the electrical isolation between the plug 160 and the first semiconductor chip 120. Thus, a dense gap between the insulating holes 126 may provide the conductive material in the portion of the first semiconductor chip 120 between the insulating holes 126 with a rapid oxidation.

In example embodiments, it may be required to fully fill the insulating holes 126 with the insulating member 164 by the CVD process or the thermal oxidation process. If the diameter of the insulating holes 126 is greater than that of the plug hole 124, the insulating holes 126 may not be fully filled with the insulating member 164 while the insulating layer 162 is formed on the inner surface of the plug hole 124. Thus, in example embodiments, the insulating holes 126 have a diameter smaller than that of the plug hole 124 in order to ensure the insulating holes 126 are properly filled to form the insulating member 164.

In example embodiments, when the insulating layer 162 is formed in the plug hole 124 by the CVD process or the thermal oxidation process, it may be required to leave a space in the plug hole 124 where the plug 160 may be formed. However, if the diameter of the insulating holes 126 is relatively large, the insulating layer 162 may partially block the plug hole 124 while the insulating holes 126 are filled with the insulating member 164. Thus, the diameter of the insulating holes 126 may be no more than two times a thickness of the insulating layer 162 in order to prevent the insulating layer 162 from filling the plug hole 124 or blocking the plug hole 124.

In example embodiments, it is possible that a thermal oxidation process could expose the first semiconductor chip 120, the circuit 128 of the first semiconductor chip 120 to relatively high heat which could damage the first semiconductor chip 120 and/or the circuit 128. Thus, the insulating layer 162 and the insulating member 164 may be formed by the CVD process.

Figure 9:
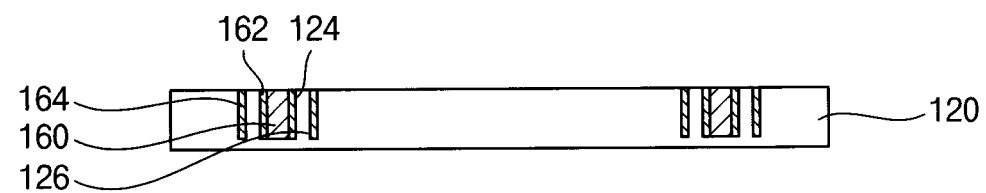

Referring to FIG. 9, the plug 160 may be formed on the insulating layer 162 to fill up the plug hole 124 with the plug 160.

Figure 10:
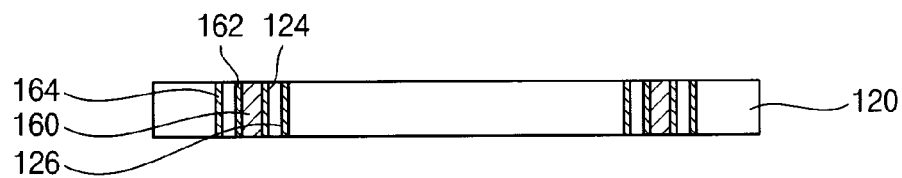

Referring to FIG. 10, the lower surface of the first semiconductor chip 120 may be removed to expose a lower end of the plug 160. In example embodiments, because the plug hole 124 and the insulating holes 126 may have substantially the same depth, a lower end of the insulating member 164 may also be exposed.

Figure 11:
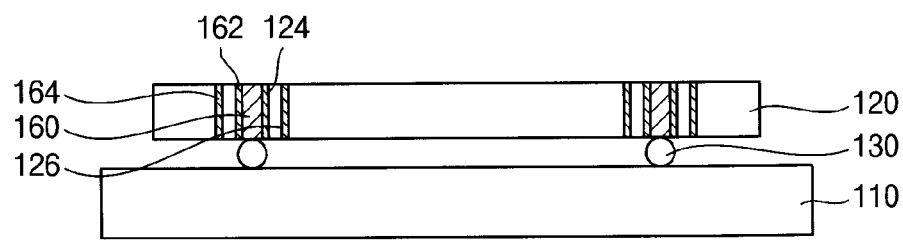

Referring to FIG. 11, the first semiconductor chip 120 may be mounted on the upper surface of the package substrate 110 via the first conductive bump 130. The first conductive bump 130 may electrically connect the lower end of the plug 160 with the circuit pattern of the package substrate 110.

Figure 12:
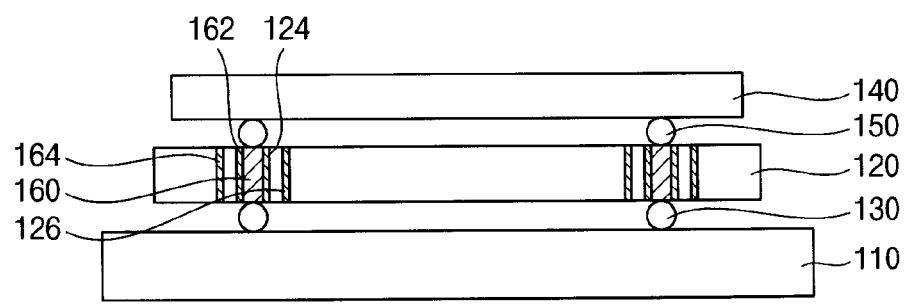

Referring to FIG. 12, the second semiconductor chip 140 may be mounted on the upper surface of the first semiconductor chip 120 via the second conductive bump 150. The second conductive bump 150 may electrically connect the upper end of the plug 160 with the second semiconductor chip 140.

Figure 13:
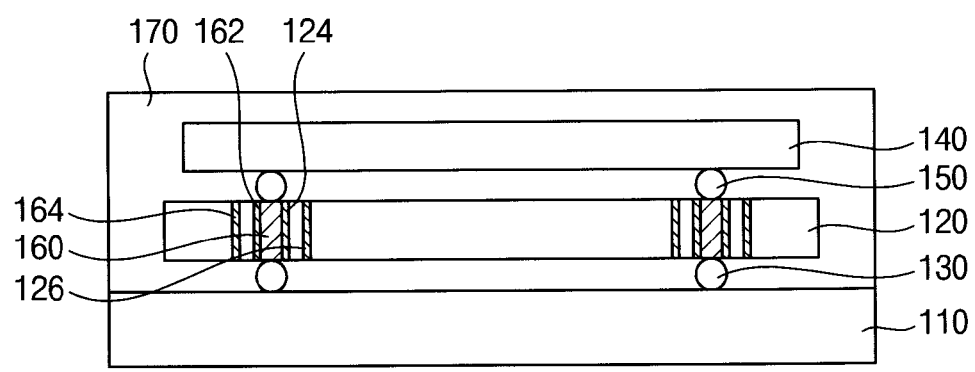

Referring to FIG. 13, the molding member 170 may be formed on the upper surface of the package substrate 110 to cover the first semiconductor chip 120 and the second semiconductor chip 140.

The external terminals 180, for example, solder balls, may be mounted on the lower surface of the package substrate 110 to complete the semiconductor package 100 in FIG. 1.

In accordance with example embodiments, the insulating hole and the insulating member around the plug hole may ensure an electrical isolation between the plug and the first semiconductor chip, and between the plugs. Thus, losses of signals through the plug may be suppressed, so that a transmission speed of the signal may be increased.

Interposer Chip

Figure 14:
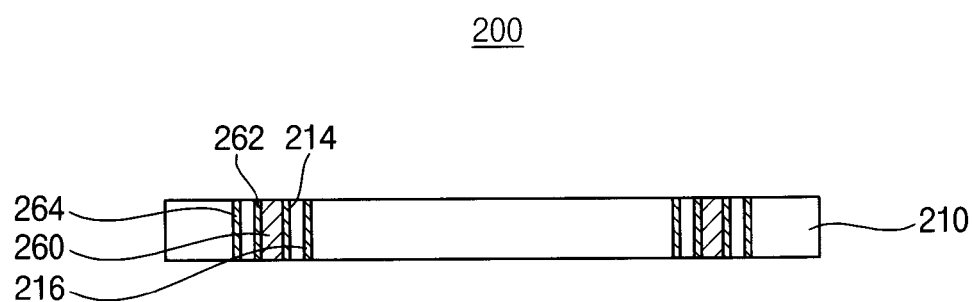

FIG. 14 is a cross-sectional view illustrating an interposer chip in accordance with example embodiments.

Referring to FIG. 14, an interposer chip 200 of example embodiments may include a conductive substrate 210, a plug 260 and an insulating member 264.

In example embodiments, the conductive substrate 210 may include silicon. The conductive substrate 210 may have a plug hole 214 and a plurality of interposer-insulating holes 216. The plug hole 214 and the interposer-insulating holes 216 may be vertically formed through the conductive substrate 210.

In example embodiments, the plug hole 214 and the interposer-insulating holes 216 may be exposed through an upper surface and a lower surface of the conductive substrate 210. Thus, the plug hole 214 and the interposer-insulating holes 216 may have substantially the same depth.

In example embodiments, the plug hole 214 may be exposed through the lower surface of the conductive substrate 210. In contrast, the interposer-insulating holes 216 may not be exposed through the lower surface of the conductive substrate 210. Thus, the interposer-insulating holes 216 may have a depth less than that of the plug hole 214.

An insulating layer 262 may be formed on an inner surface of the plug hole 214. In example embodiments, the insulating layer 262 may include oxide. The plug 260 may be formed on the insulating layer 262 to fill up the plug hole 214.

In example embodiments, the interposer-insulating holes 216 may be arranged around the plug holes 214. The interposer-insulating holes 216 may have a diameter smaller than that of the plug holes 214. The interposer-insulating holes 216 may have a diameter of no more than two times a thickness of the insulating layer 262.

In example embodiments, the interposer-insulating holes 216 may be arranged in a single concentric circle around the plug hole 214. Alternatively, the interposer-insulating holes 216 may be arranged in at least two concentric circles around the plug hole 214.

In order to more ensure the electrical isolation between the plug 260 and the conductive substrate 210, the insulating member 264 may be formed in the interposer-insulating holes 216. In example embodiments, the insulating member 264 may include a material substantially the same as that of the insulating layer 262. Thus, the insulating member 264 may include oxide. That is, the insulating layer 262 and the insulating member 264 may be formed by a same process.

In example embodiments, a method of manufacturing the interposer chip 200 may include processes substantially similar to those illustrated with reference to FIGS. 7 to 10. Thus, any further illustrations with respect to the method are omitted herein for brevity.

In example embodiments, because the interposer chip 200 may not have a circuit, the insulating layer 262 and the insulating member 264 may be formed by a thermal oxidation process. In example embodiments, the plug hole 214 may not be fully filled with the insulating member 262 and while the interposer-insulating holes 216 may be filled with the insulating member 264.

Semiconductor Package

Figure 15:
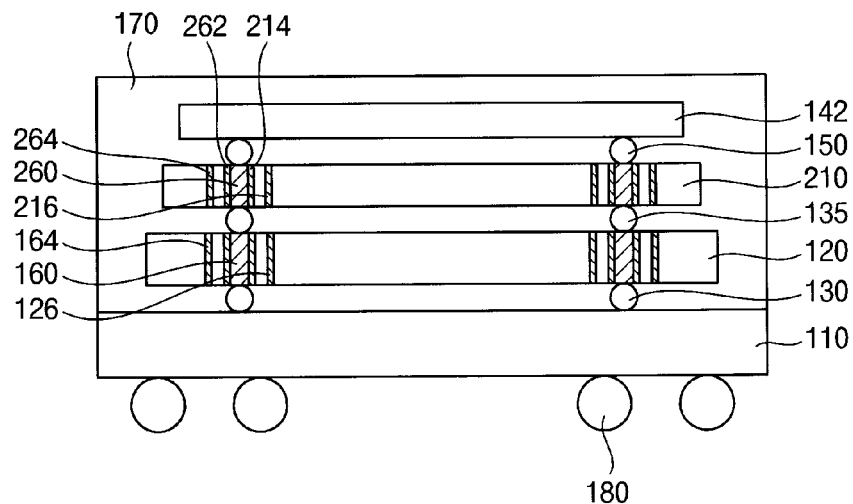

FIG. 15 is a cross-sectional view illustrating a semiconductor chip in accordance with example embodiments.

Referring to FIG. 15, a semiconductor package 300 of example embodiments may include a package substrate 110, a first semiconductor chip 120, a first conductive bump 130, an interposer chip 200, an interposer bump 135, a second semiconductor chip 142, a second conductive bump 150, a molding member 170 and external terminals 180.

In example embodiments, the package substrate 110, the first semiconductor chip 120, the first conductive bump 130, a second conductive bump 150, a molding member 170 and external terminals 180 may be substantially the same as the package substrate 110, the first semiconductor chip 120, the first conductive bump 130, a second conductive bump 150, a molding member 170 and external terminals 180 illustrated with reference to FIG. 1, respectively. Thus, the same reference numerals may refer to the same element and any further illustrations with respect to the package substrate 110, the first semiconductor chip 120, the first conductive bump 130, a second conductive bump, a molding member 170 and external terminals 180 may be omitted herein for brevity.

In example embodiments, the interposer chip 200 may include elements substantially the same as those of the interposer chip in FIG. 14. The same reference numerals may refer to the same element and any further illustrations with respect to the same elements may be omitted herein for brevity.

The interposer chip 200 may be mounted on the upper surface of the first semiconductor chip 120 via the interposer bump 135. The interposer bump 135 may be interposed between the interposer plug 260 of the interposer chip 200 and the plug 160 of the first semiconductor chip 120 to electrically connect the plugs 160 and 260 with each other.

In example embodiments, the first semiconductor chip 120 and the interposer chip 200 may be electrically connected with each other via a conductive wire. Alternatively, the first semiconductor chip 120 and the interposer chip 200 may be directly connected with each other by directly contacting the plugs 160 and 260 with each other.

The second semiconductor chip 142 may be mounted on the upper surface of the interposer chip 200 via the second conductive bump 150. The second conductive bump 150 may electrically connect the second semiconductor chip 142 to the interposer plug 260 of the interposer chip 200. In example embodiments, the second semiconductor chip 142 may have a size smaller than that of the first semiconductor chip 120. Thus, because it may be difficult to directly connect the second semiconductor chip 142 with the first semiconductor chip 120, the second semiconductor chip 142 may be indirectly connected to the first semiconductor chip 120 via the interposer chip 200.

In example embodiments, the interposer chip 200 and the second semiconductor chip 142 may be electrically connected with each other via a conductive wire. Alternatively, the interposer chip 200 and the second semiconductor chip 142 may be directly connected with each other by directly contacting a bonding pad of the second semiconductor chip 142 with the interposer plug 260 of the interposer chip 200.

In example embodiments, a method of manufacturing the semiconductor package 300 may include processes substantially the same as those illustrated with reference to FIGS. 7 to 13 except for further including interposing the interposer chip 200 between the first semiconductor chip 120 and the second semiconductor chip 142. Thus, any further illustrations with respect to the method may be omitted herein for brevity.

According to example embodiments, the insulating hole and the insulating member may ensure an electrical isolation between the plug and the first semiconductor chip, and between the plugs. Thus, losses of signals through the plug may be suppressed, so that a transmission speed of the signal may be increased.

Figure 16:
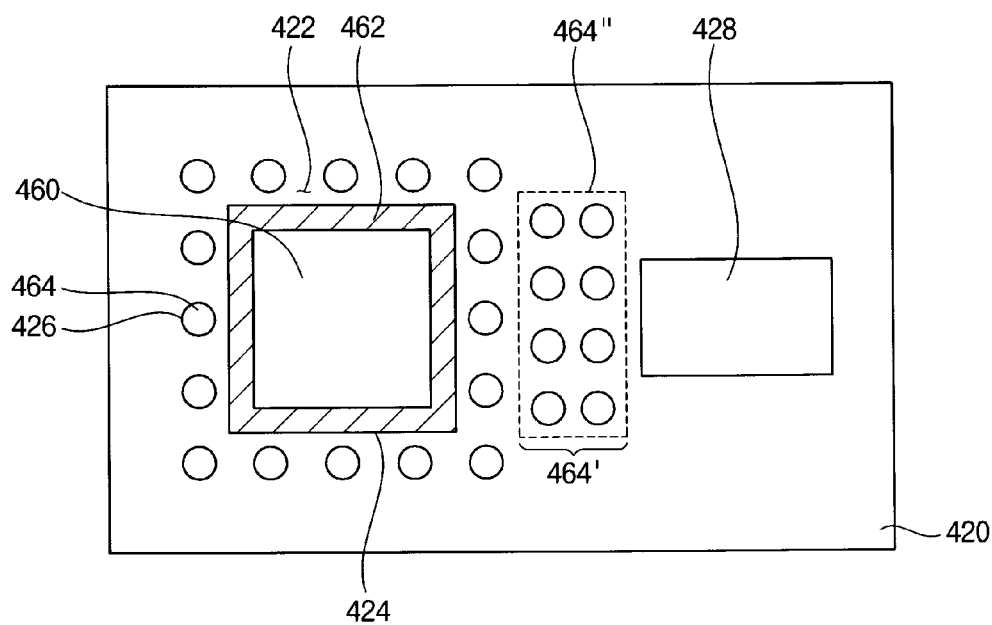
FIG. 16 is a plan view illustrating a semiconductor chip.

FIG. 16 is an example of a plan view illustrating a semiconductor chip 420. The example illustrated in FIG. 16 is similar to that of FIG. 4 except that in FIG. 16 the plug 460 is square shaped. Like FIG. 4, the plug 460 is surrounded by a plurality of insulation holes 426 which may be filled with insulating members 464. In example embodiments, the plug 426 may be formed in a plug hole 424 with an insulating layer 462 formed between sidewalls of the plug hole 424 and the plug 460. In example embodiments, a plurality of insulating members 464' may be formed between a circuit 428 and the plug 460. Example embodiments, however, are not limited thereto. For example, the plurality of insulating members 464' may be replaced with a single relatively large insulation member 464" illustrated by the dotted line.

Figure 17:
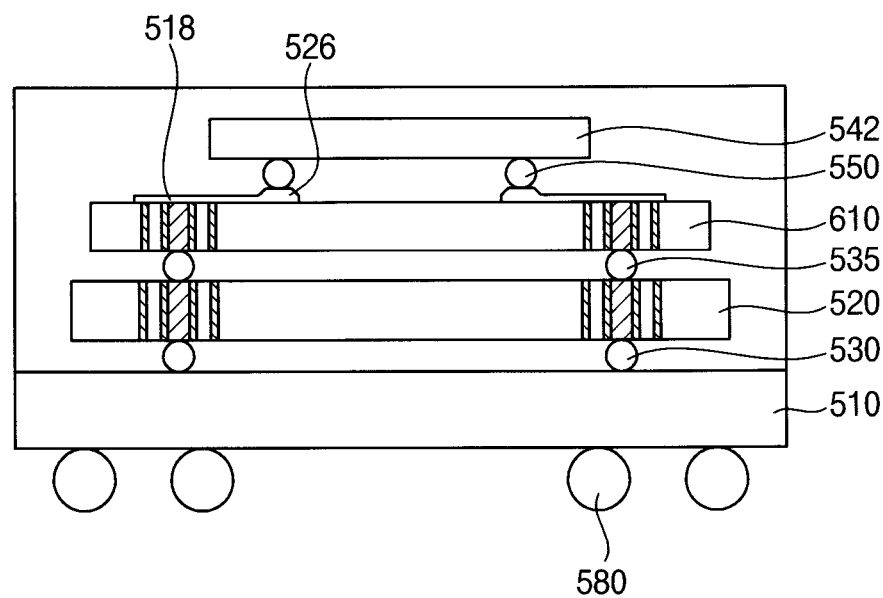
FIG. 17 is a cross section of a semiconductor package in accordance with example embodiments.

FIG. 17 is a cross section of a semiconductor package 500 in accordance with example embodiments. The semiconductor package 500 is similar to the semiconductor package 300 of FIG. 15. Like the semiconductor package 300, the semiconductor package 500 includes external terminals 580, a package substrate 510, first conductive bumps 530, a first semiconductor chip 520, an interposer bump 535, an interposer 610, a second conductive bump 550, and a second semiconductor chip 542. In example embodiments, the first semiconductor chip 520 may be substantially the same as the first semiconductor chip 120. Furthermore, the interposer 610 may be substantially the same as the conductive substrate 210. For example, the interposer 610 may include a plug 560 in a plug hole 514. However, in FIG. 17, the interposer 610 further includes a conductive pattern 518 extending from a pad 526 on an upper surface of the interposer 610 to the plug 560. This arrangement allows for a differently sized second semiconductor chip 542 to connect to the first semiconductor chip 520.

The foregoing is illustrative of example embodiments and is not to be construed as limiting thereof Although example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to example embodiments, as well as other example embodiments, are intended to be included within the scope of the appended claims.

What is claimed is:

1. A semiconductor package comprising:
 a package substrate;
 a first semiconductor chip on the package substrate, the first semiconductor chip having a plug electrically connected to the package substrate and at least one insulating hole adjacent the plug, the insulating hole physically separated from the plug; and
 a second semiconductor chip on the first semiconductor chip, the second semiconductor chip electrically connected to the plug.

2. The semiconductor package of claim 1, further comprising:
 at least one insulating member in the at least one insulating hole.

3. The semiconductor package of claim 1, wherein the at least one insulating hole is a plurality of insulating holes arranged in a concentric circle around the plug.

4. The semiconductor package of claim 1, wherein the insulating hole has a diameter smaller than that of the plug.

5. The semiconductor package of claim 1, wherein the at least one insulating hole has one of a depth substantially the same as a thickness of the plug and a depth less than the thickness of the plug.

6. The semiconductor package of claim 1, further comprising:
 an insulating layer between an inner surface of a plug hole and the plug, and the at least one insulating hole has a diameter of no more than about two times a thickness of the insulating layer.

7. The semiconductor package of claim 1, wherein a gap between the plug and the at least one insulating hole is substantially the same as a width of a depletion region between a circuit of the first semiconductor chip and the plug.

8. The semiconductor package of claim 7, wherein the at least one insulating hole is a plurality of insulating holes concentratedly arranged between the circuit of the first semiconductor chip and the plug.

9. The semiconductor package of claim 1, further comprising:
 a first conductive bump between the package substrate and the first semiconductor chip, the first conductive bump electrically connecting the plug with the package substrate; and
 a second conductive bump between the first semiconductor chip and the second semiconductor chip, the second conductive bump electrically connecting the plug with the second semiconductor chip.

10. The semiconductor package of claim 1, further comprising:

an interposer chip between the first semiconductor chip and the second semiconductor chip.

11. The semiconductor package of claim 10, wherein the interposer chip comprises:
a conductive substrate;
an interposer plug in the conductive substrate, the interposer plug electrically connecting the plug with the second semiconductor chip; and
at least one interposer-insulating hole adjacent the interposer plug.

12. A semiconductor chip comprising:
a plug extending through a thickness of the semiconductor chip; and
a plurality of insulating holes surrounding the plug, the plurality of insulating holes physically separated from the plug and reinforcing an electrical isolation between the plug and the semiconductor chip.

13. The semiconductor chip of claim 12, further comprising:
a plurality of insulating members in the plurality of insulation holes.

14. The semiconductor chip of claim 12, further comprising:
an insulation layer on side walls of a plug hole that extends through the thickness of the semiconductor chip, the insulation layer being between the side walls of the plug hole and the plug.

15. The semiconductor chip of claim 12, further comprising:
a circuit; and
a second plurality of insulating holes between the circuit and the plug.

16. The semiconductor chip of claim 12, wherein the plurality of insulating holes extend through the thickness of the semiconductor chip.

17. The semiconductor chip of claim 1, wherein the at least one insulating hole is defined through the semiconductor chip, the at least one insulating hole configured to expose at least one of top and bottom surfaces of the first semiconductor chip.

* * * * *